United States Patent
Joshi et al.

(10) Patent No.: US 10,304,507 B2
(45) Date of Patent: May 28, 2019

(54) MEMORY PROVIDING SIGNAL BUFFERING SCHEME FOR ARRAY AND PERIPHERY SIGNALS AND OPERATING METHOD OF THE SAME

(71) Applicant: SAMSUNG ELECTRONICS CO., LTD., Suwon-si (KR)

(72) Inventors: Manish Chandra Joshi, Bangalore (IN); Parvinder Kumar Rana, Bangalore (IN); Akash Kumar Gupta, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/870,013

(22) Filed: Jan. 12, 2018

(65) Prior Publication Data

US 2018/0204607 A1   Jul. 19, 2018

(30) Foreign Application Priority Data

Jan. 13, 2017  (IN) .............................. 201741001538

(51) Int. Cl.
| | |
|---|---|
| *G11C 8/00* | (2006.01) |
| *G11C 7/18* | (2006.01) |
| *G11C 5/06* | (2006.01) |
| *G11C 7/02* | (2006.01) |
| *G11C 8/14* | (2006.01) |
| *G11C 7/22* | (2006.01) |
| *G11C 7/10* | (2006.01) |

(52) U.S. Cl.
CPC ................ *G11C 8/00* (2013.01); *G11C 5/063* (2013.01); *G11C 7/02* (2013.01); *G11C 7/18* (2013.01); *G11C 8/14* (2013.01); *G11C 7/1051* (2013.01); *G11C 7/1078* (2013.01); *G11C 7/22* (2013.01)

(58) Field of Classification Search
CPC ....... G11C 7/18; G11C 7/1051; G11C 7/1078; G11C 7/22
See application file for complete search history.

(56) References Cited

U.S. PATENT DOCUMENTS

| 5,783,471 A | 7/1998 | Chu |
| 5,933,387 A | 8/1999 | Worley |
| 6,198,682 B1 * | 3/2001 | Proebsting ............. G11C 7/065 |
| | | 257/E21.659 |
| 2003/0035336 A1 * | 2/2003 | Terzioglu ................ G11C 7/06 |
| | | 365/230.03 |

(Continued)

*Primary Examiner* — Ajay Ojha
(74) *Attorney, Agent, or Firm* — Sughrue Mion, PLLC (57) ABSTRACT

A memory for providing a signal buffering scheme for array and periphery signals and the operating method of the same are provided. The memory includes a plurality of columns of memory cells, a control circuit, and a control logic unit. The plurality of columns of memory cells may be connected to a local array signal generator via local control lines, which are connected to a global array signal generator via global control lines for receiving array signals. The control circuit may be connected to the memory cells for providing periphery signals. The control logic unit may be connected to the memory cells through a hierarchical structure of the global control lines and the local control lines. The control logic unit may be configured to provide the array signals and periphery signals having the same polarity to the global control lines and the local control lines.

18 Claims, 7 Drawing Sheets

(56) References Cited

U.S. PATENT DOCUMENTS

2003/0156485 A1\* 8/2003 Tomita ................ G11C 8/14
                                                365/230.03
2013/0315022 A1\* 11/2013 Anand ................ G11C 7/10
                                                365/230.03

\* cited by examiner

MEMORY PROVIDING SIGNAL BUFFERING SCHEME FOR ARRAY AND PERIPHERY SIGNALS AND OPERATING METHOD OF THE SAME

CROSS-REFERENCE TO RELATED APPLICATION

This application claims priority from Indian Patent Application No. 201741001538 (CS), filed on Jan. 13, 2017 in the Indian Intellectual Property Office, the disclosure of which is incorporated herein in its entirety by reference.

BACKGROUND

The present disclosure generally relates to a memory architecture, and more particularly relates to a memory system providing signal buffering scheme for array and periphery signals.

Memory structures have become integral part of digital processing systems. Generally, it is desirable to incorporate as many memory cells as possible into a given area of memory structure. However, memory cell density is typically constrained by other factors such as layout efficiency, performance, power requirements and noise sensitivity.

The above-mentioned constraints impose limitations upon memory structure designs making it challenging to achieve compact, high performance, and high-bandwidth integrated computing systems. Yield enhancement circuitry for memory integrated circuits is utilized in the art. Memory integrated circuits are formed of multiple arrays of memory cells. Each memory array is constructed of rows and columns of memory cells. Normally, the rows of memory cells are selected by an address decoder. The columns of memory cells are bounded by read/write buffers that retrieve data from and store data to the selected memory cell. A column decoder provides a selection mechanism to guide data from a selected column to the read/write buffers. The output of the read/write buffer is transferred to an input/output driver and receiver to transfer the data between the memory cells and external circuitry.

Figure 1:
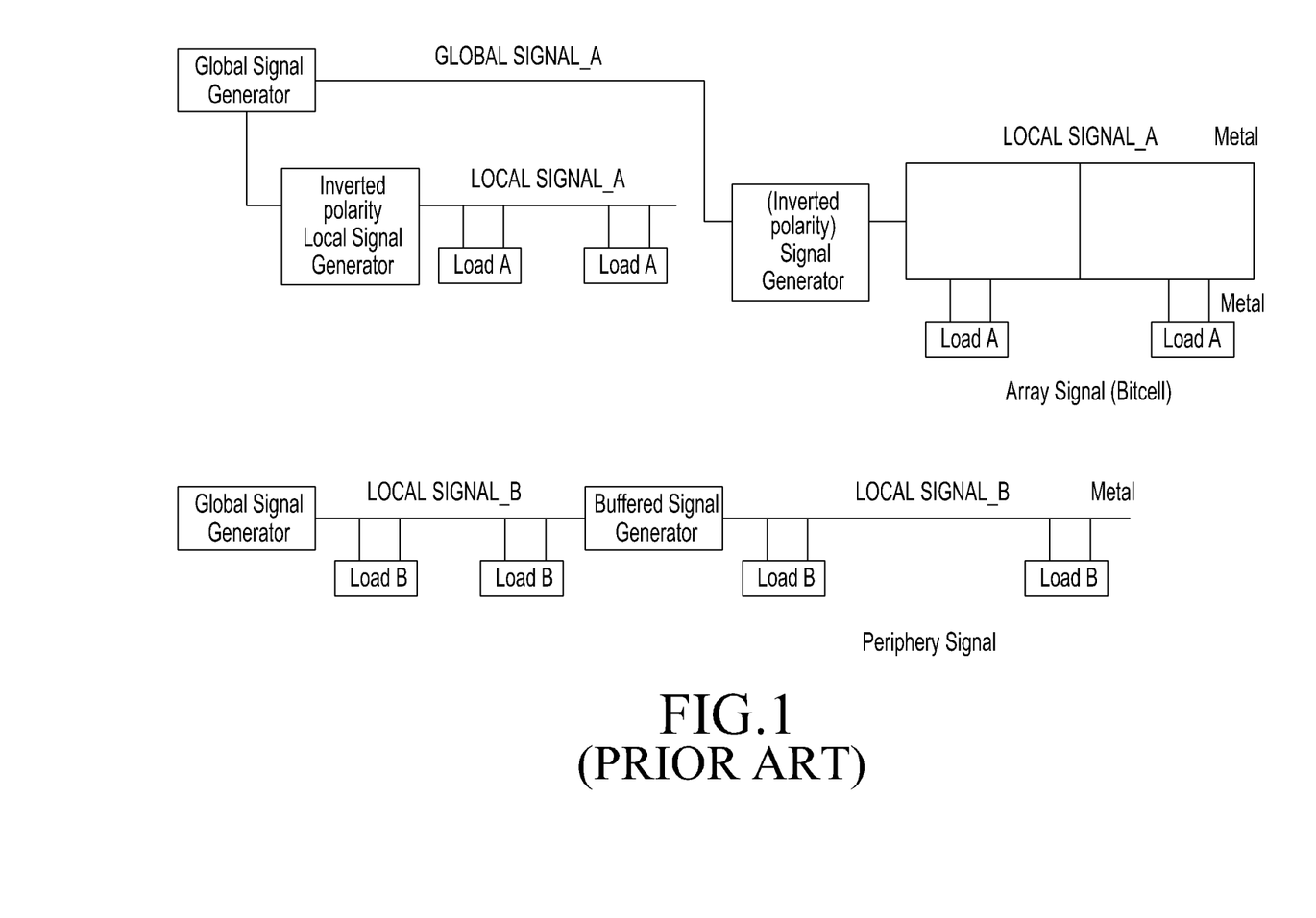
FIG. 1 is a schematic diagram illustrating global and local inversion scheme for array and periphery signals as re-buffered, according to the related art.

FIG. 1 is a schematic diagram illustrating a global and local inversion scheme for array and periphery signals as re-buffered, according to the related art. According to the related art scheme, a global signal and a local signal for bit cell array are opposite in polarity. As these signals are running along long lines, the opposite polarity aggravates the coupling issue, which deteriorates a slope of a local signal LOCAL SIGNAL_A heavily at the 90% to 100% region. Also, the periphery signal is re-buffered and has a single metal line which leads to relatively higher resistor-capacitor (RC) delay with respect to the array signal, thereby deteriorating the performance of design. Further, the array signal and the periphery signal should be able to track each other to have similar read and write performance at different columns.

Therefore, there is a need for a memory architecture based on varying columns in order to optimize performance and area utilization. Additionally, the architecture is adapted to provide signal buffering scheme for array and periphery signals.

SUMMARY

According to an aspect of an example embodiment, a memory comprises: a plurality of columns of memory cells configured to receive array signals; a control circuit connected to each column of the memory cells, for providing periphery signals; and a control logic unit connected to the control circuit and each column of the memory cells through a hierarchical structure of global control lines and local control lines. The control logic unit adapted to provide the array signals having same polarity to the global control lines and the local control lines, and the periphery signals having same polarity to the global control lines and the local control lines.

According to an aspect of an example embodiment, a system may include a global array signal generator configured to generate global array signals; a local array signal generator connected to the global array signal generator, and configured to receive the global array signals from the global array signal generator and generate local array signals based on the global array signals; a global periphery signal generator configured to generate global periphery signals; a local periphery signal generator, connected to the global periphery signal generator, and configured to receive the global periphery signals and generate local periphery signals based on the global periphery signals; a plurality of columns of memory cells; a control circuit connected to each of the plurality of columns of the memory cells through a local periphery signal generator, which is connected to a global periphery signal generator, for providing periphery signals; and a control logic unit is connected to the control circuit and the each of the plurality of columns of the memory cells through a hierarchical structure of global control lines and local control lines. The control logic unit may be configured to provide the global array signals and the local array signals, having a same polarity with each other, to the global control lines and the local control lines, and provide the global periphery signals and the local periphery signals, having the same polarity, to the global control lines and the local control lines.

The control logic unit may include at least one of a decoder, a buffer, a rebuffer, for each column of the plurality of columns of the memory cells.

The rebuffer may be connected between the global control lines in each of the plurality of columns of the memory cells where a number of the memory cells exceeds a predefined number.

Each of the local control lines may be configured to provide a local control signal though parallel metal bit lines of one of a same type and a different type in the local control lines where a number of the memory cells exceeds a predefined number.

The memory system may further include rebuffer configured to provide a two-sided local buffered signal for generating local array signals and local periphery signals. The control logic unit may have the hierarchical structure of the global control lines and the local control lines for providing the array signals and the periphery signals. The control logic unit may be further configured to reduce delay between a global array signal and a global periphery signal.

The control logic unit may have the hierarchical structure of the global control lines and the local control lines for providing the array signals and the periphery signals. The control logic unit may be configured to reduce delay between a local array signal and a local periphery signal.

According to an aspect of an example embodiment, a memory comprises: a global signal generator configured to generate a global array signal; a global word line segment connected to the global signal generator, wherein a first end of the global word line segment is connected to the global signal generator via a first rebuffer, and a second end of the global word line segment is connected to a first buffer; a first local word line segment connected to the global signal generator via the first rebuffer and a second rebuffer, wherein a first end of the first local word line segment is connected to the first end of the global word line segment via the second rebuffer and a second end of the first local word line segment is connected to the first buffer via a second buffer; and a second local word line segment connected to the global word line segment via a third buffer, wherein the first local word line segment is configured to drive a first group of bit cell loads and the second local word line segment is configured to drive a second group of bit cell loads.

The first group of bit cell loads may have a greater number of bit cells loads than the second group of bit cell loads.

The first group of bit cell loads may be at least two times more than the second group of bit cell loads.

The global word line segment and the first local word line segment may have same polarity signals.

According to an aspect of an example embodiment, a method operating by a memory comprises: generating global array signals; generating local array signals based on the global array signals; generating global periphery signals; generating local periphery signals based on the global periphery signals; providing the global array signals and the local array signals, having a same polarity with each other, to global control lines and local control lines; and providing the global periphery signals and the local periphery signals, having the same polarity, to the global control lines and the local control lines.

The foregoing has outlined, in general, the various aspects of exemplary embodiments and is to serve as an aid to better understanding the more complete detailed description which is to follow. The present disclosure is not limited to the method or application of use described and illustrated herein. It is intended that any other advantages and objects of the present disclosure that become apparent or obvious from the detailed description or illustrations contained herein are within the scope of the present disclosure.

BRIEF DESCRIPTION OF THE DRAWINGS

The above and/or other aspects will become apparent and more readily appreciated from the following description of example embodiments, taken in conjunction with the accompanying drawings, in which.

DETAILED DESCRIPTION

Example embodiments will now be made in detail, with reference to the accompanying drawings. These example embodiments are described in sufficient detail to enable those skilled in the art to practice the inventive concept, and it is to be understood that other embodiments may be utilized and that changes may be made without departing from the scope of the present disclosure. The following detailed description is, therefore, not to be taken in a limiting sense. Although specific features of the present disclosure are shown in some drawings and not in others, this is done for convenience only, and each feature may be combined with any or all of the other features in accordance with the present disclosure.

The specification may refer to "an," "one" or "some" embodiment(s) in several locations. This does not necessarily imply that each such reference is to the same embodiment(s), or that the feature only applies to a single embodiment. Single features of different embodiments may also be combined to provide other embodiments.

As used herein, the singular forms "a," "an," and "the" are intended to include the plural forms as well, unless expressly stated otherwise. It will be further understood that the terms "includes," "comprises," "including" and/or "comprising" when used in this specification, specify the presence of stated features, integers, steps, operations, elements and/or components, but do not preclude the presence or addition of one or more other features integers, steps, operations, elements, components and/or groups thereof. As used herein, the term "and/or" includes any and all combinations and arrangements of one or more of the associated listed items.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Generally, memory devices/systems include one or more system on chip (SoC) circuits, such as processors, integrated circuits (IC), etc., along with a plurality of on-chip memory devices. The on-chip memory devices include one or more read-only memories (ROMs) that store instructions set for the processor and register files which are used inside multi-core processors. ROMs allow the processor to write data and from which the processor could read data. The processor communicates with an external cache memory, which is generally a static random access memory (SRAM). The processor also communicates with numerous peripheral devices such as input devices, output devices, and data storage devices. The on-chip memories include two types of hardware circuits such as a bitcell array including an array of bitcells, where each bitcell stores 1 bit of data, and a periphery circuit including logic gates circuits to control read and write operations.

Figure 2:
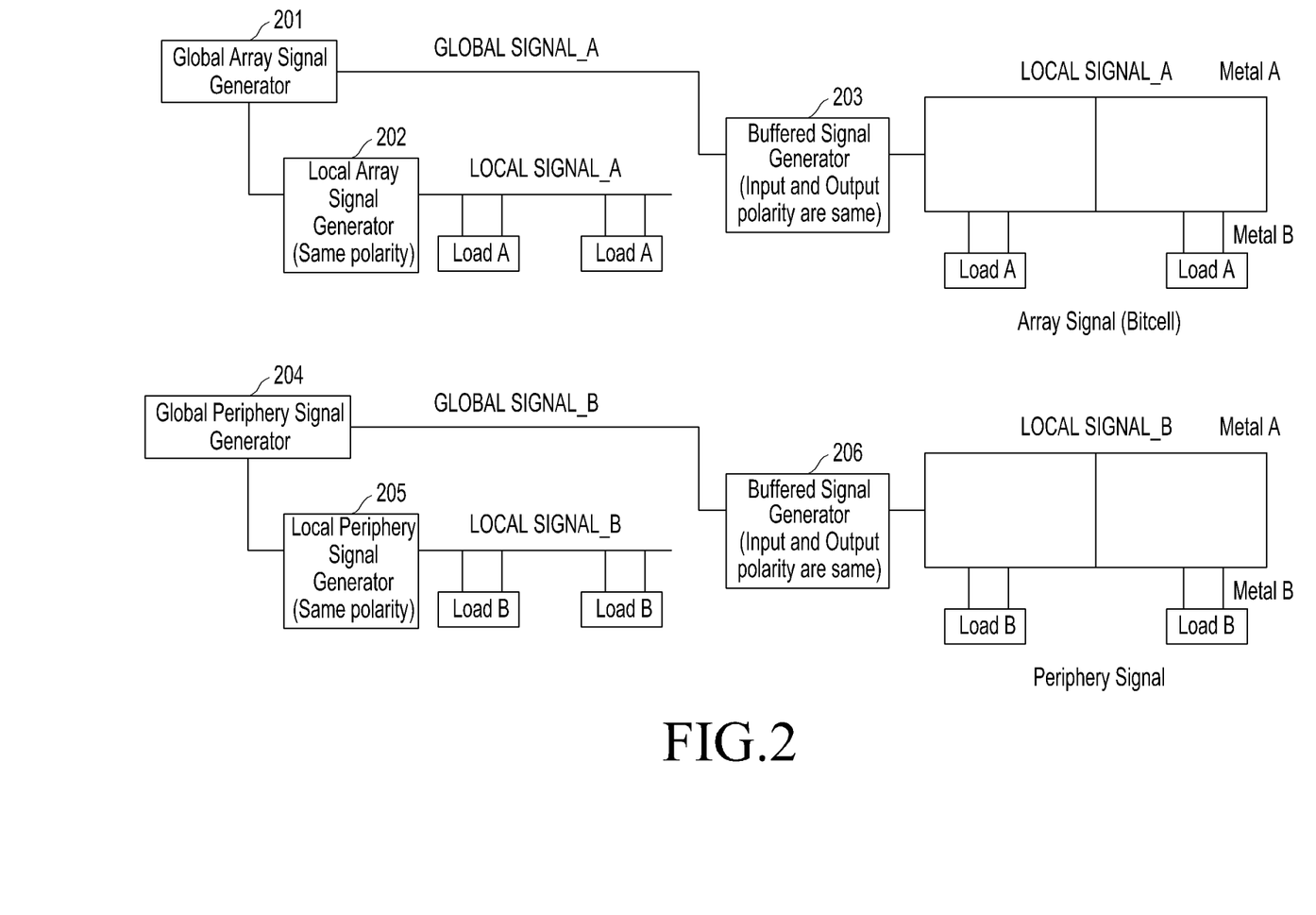
FIG. 2 is a schematic diagram illustrating a global and local buffering scheme for array and periphery signals without any inversion, according to an example embodiment.

FIG. 2 is a schematic diagram illustrating a global and local buffering scheme for array and periphery signals without any inversion in the memory system, according to an exemplary embodiment. According to an aspect of the example embodiment, the same global to local scheme is provided for both array and periphery signals, thus improving tracking (e.g., reduced delay) between array and periphery signals. A global array signal generator 201 for generating global array signals provides an input signal GLOBAL SIGNAL_A to a local array signal generator 202, by which local array signals generated have the same polarity as the global array signals generated by the global array signal generator 201, and the local array signal generator 202 outputs an input signal LOCAL SIGNAL_A that is provided to a load A. The load A includes bit cells. The global array signal generator 201 also provides an input signal GLOBAL SIGNAL_A to a buffered signal generator 203 where input and output polarities are the same and the buffered signal generator 203 provides an output signal LOCAL SIGNAL_A to metal bit lines (e.g., control lines), metal A and metal B. A global periphery signal generator 204 for generating periphery signals also provides an input signal GLOBAL SIGNAL_B to a local periphery signal generator 205 (by which local periphery signals generated by have the same polarity as the global periphery signals generated by the global periphery signal generator 204), which in turn provides an input signal LOCAL SIGNAL_B to a load B. The load B may include precharge, read column select, write column select, sense precharge, sense amplifier enable, etc. The global periphery signal generator 204 also provides an input signal GLOBAL SIGNAL_B to a buffered signal generator 206 where input and output polarities are the same and the buffered signal generator 206 feeds an output signal LOCAL SIGNAL_B to metal bit lines, metal A and metal B.

Also, both array and periphery signals have the same polarity, which eliminates the opposite coupling effect. Further, the example embodiment provides optimized distribution, where higher load columns are fed with parallel metal bit lines (e.g., control lines) to reduce resistance, which significantly improves the RC delay of signal slopes. Global and local control lines may be arranged in a hierarchical structure. The above-mentioned features result in high performance and robustness of design. The metal bit lines may be of the same type and material or they may be of different types and materials.

Figure 3:
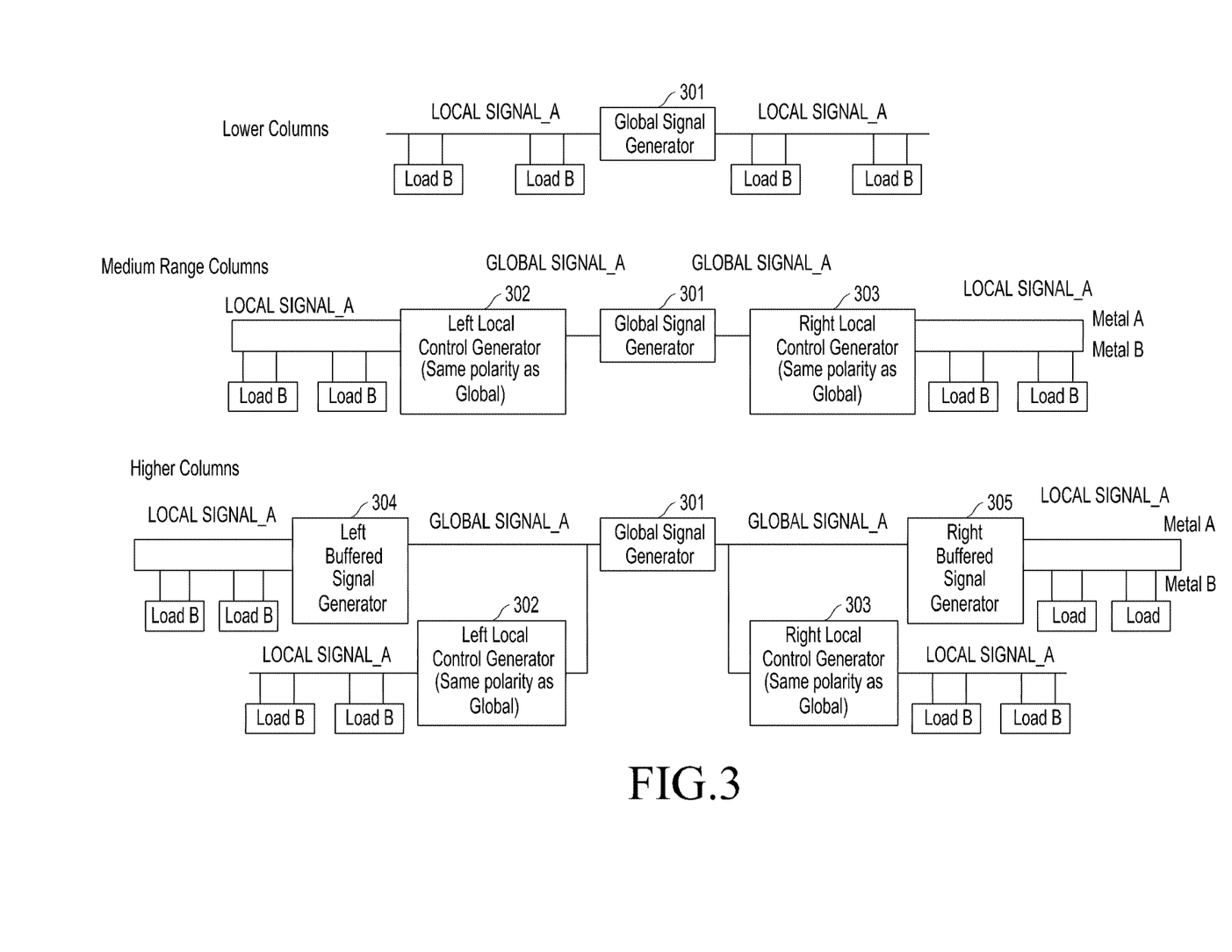
FIG. 3 is a schematic diagram illustrating a flexible architecture based on varying columns, according to an example embodiment.

FIG. 3 is a schematic diagram illustrating a flexible architecture based on varying columns, according to an example embodiment. The example embodiment provides a flexible architecture based on varying columns to optimize performance and area utility. As shown in FIG. 3, for higher range columns, a global signal generator 301, a left local control generator 302, a right local control generator 303, a left buffered signal generator 304 and a right buffered signal generator 305 are used to optimize delay. For medium range columns, the left buffered signal generator 304 and the right buffered signal generator 305 (rebuffers) may be removed to save area and reduce delay. For lower range columns, the left local control generator 302 and the right local control generator 303 (buffers) may also be removed to further save area and reduce delay. The distinctions among the higher range columns, the medium range columns and the lower range columns may be done with respect to one or more predetermined threshold values for the number of columns.

Figure 4:
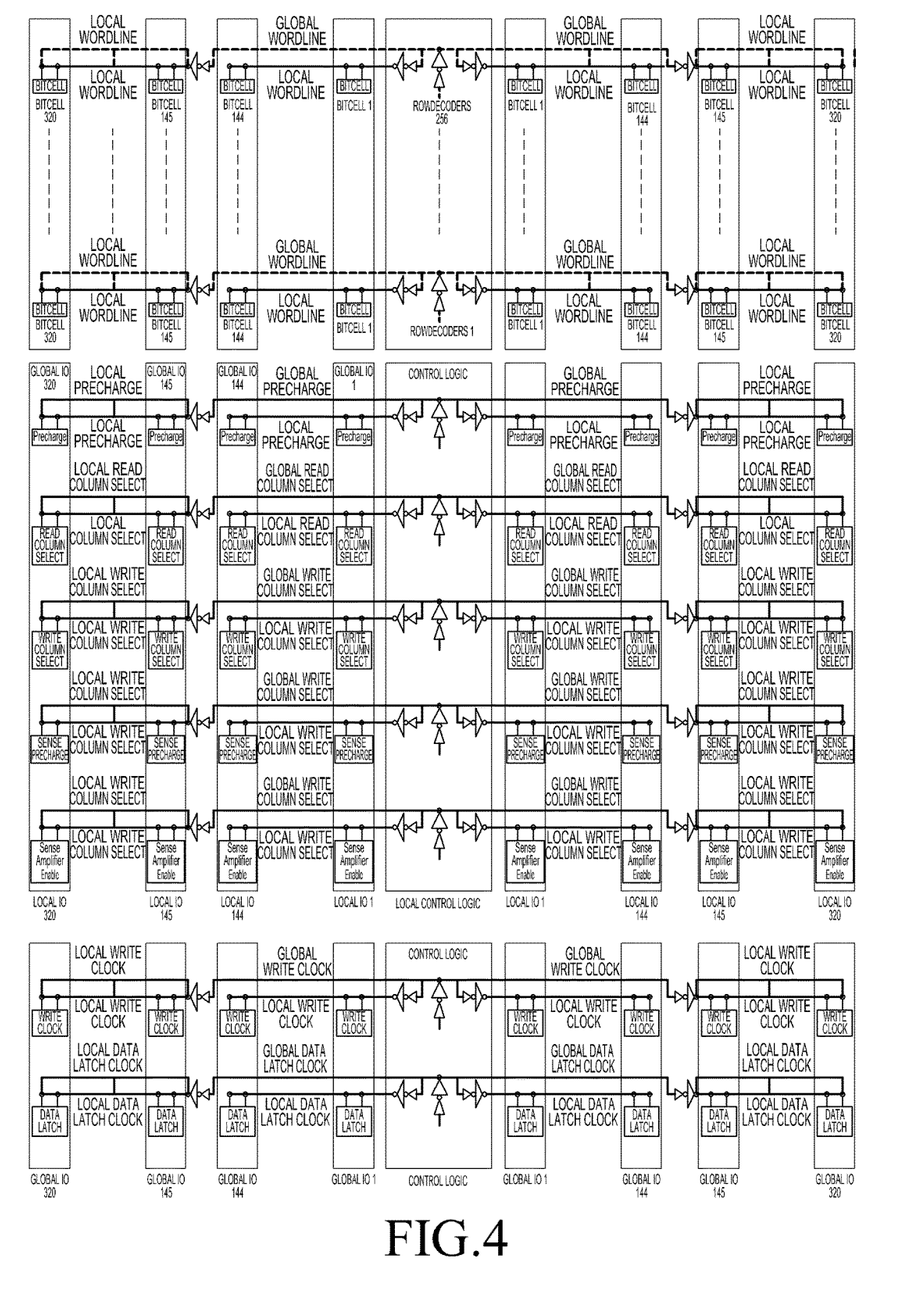
FIG. 4 is a schematic diagram illustrating a flexible architecture based on higher range columns, according to an example embodiment.

FIG. 4 is a schematic diagram illustrating a flexible architecture based on higher range columns, according to an example embodiment. According to an aspect of the example embodiment, when a number of columns in memory structure is in a higher range (e.g., above a threshold value), rebuffers (i.e., left buffered signal generator and the right buffered signal generator) are used to optimize (e.g., reduce) delay. In the memory structure, after the rebuffers, two metal bit lines are used for the global to local scheme and are merged to reduce resistance.

Figure 5:
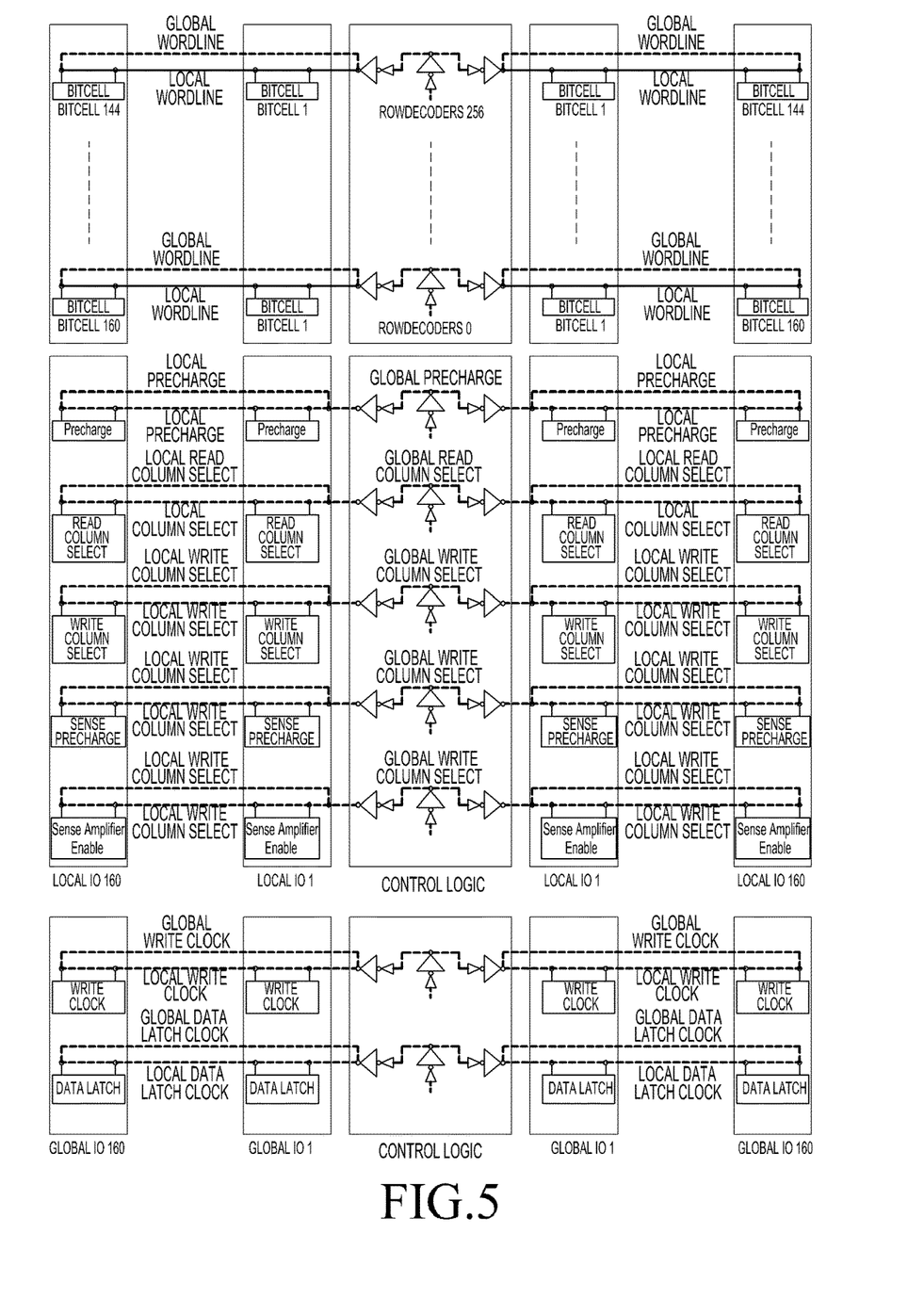
FIG. 5 is a schematic diagram illustrating a flexible architecture based on medium range columns, according to an example embodiment.

FIG. 5 is a schematic diagram illustrating a flexible architecture based on medium range columns, according to an example embodiment. According to an aspect of the example embodiment, when a number of columns in memory structure is in the medium range (e.g., between two threshold values), rebuffers (i.e., left buffered signal generator and right buffered signal generator) are removed to save area and reduce delay. In memory structure, after the rebuffers, two metal bit lines are used for the global to local scheme and are merged to reduce resistance.

Figure 6:
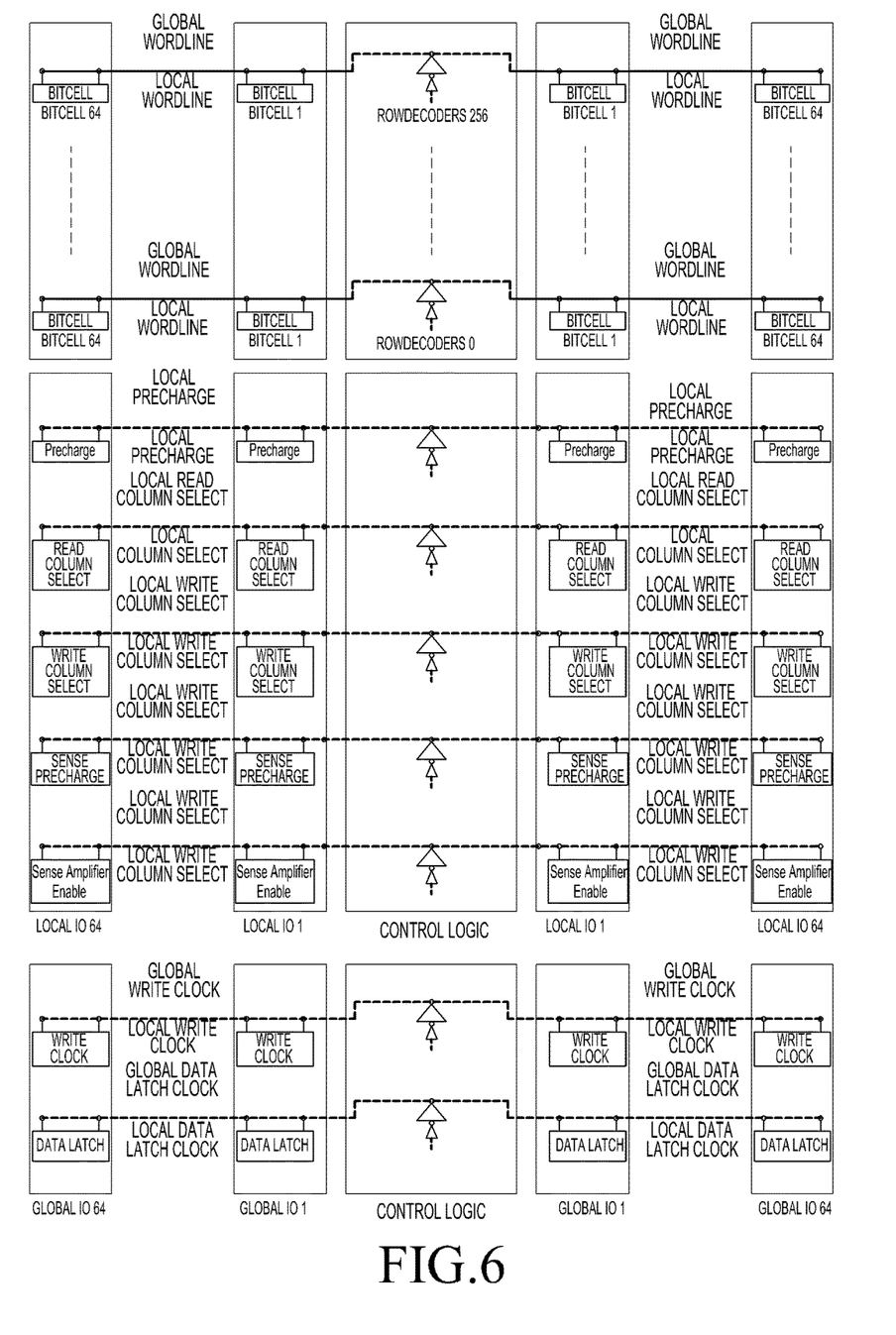
FIG. 6 is a schematic diagram illustrating a flexible architecture based on lower range columns, according to an example embodiment.

FIG. 6 is a schematic diagram illustrating a flexible architecture based on lower range columns, according to an example embodiment. According to an aspect of the example embodiment, when a number of columns in memory structure is in the lower range (e.g., below a threshold value), buffers (i.e., left local control generator and right local control generator) are also removed to further save area and reduce delay. In memory structure, a single metal bit line (e.g., a single-lane metal bit line) is used to reduce capacitance effect.

Figure 7:
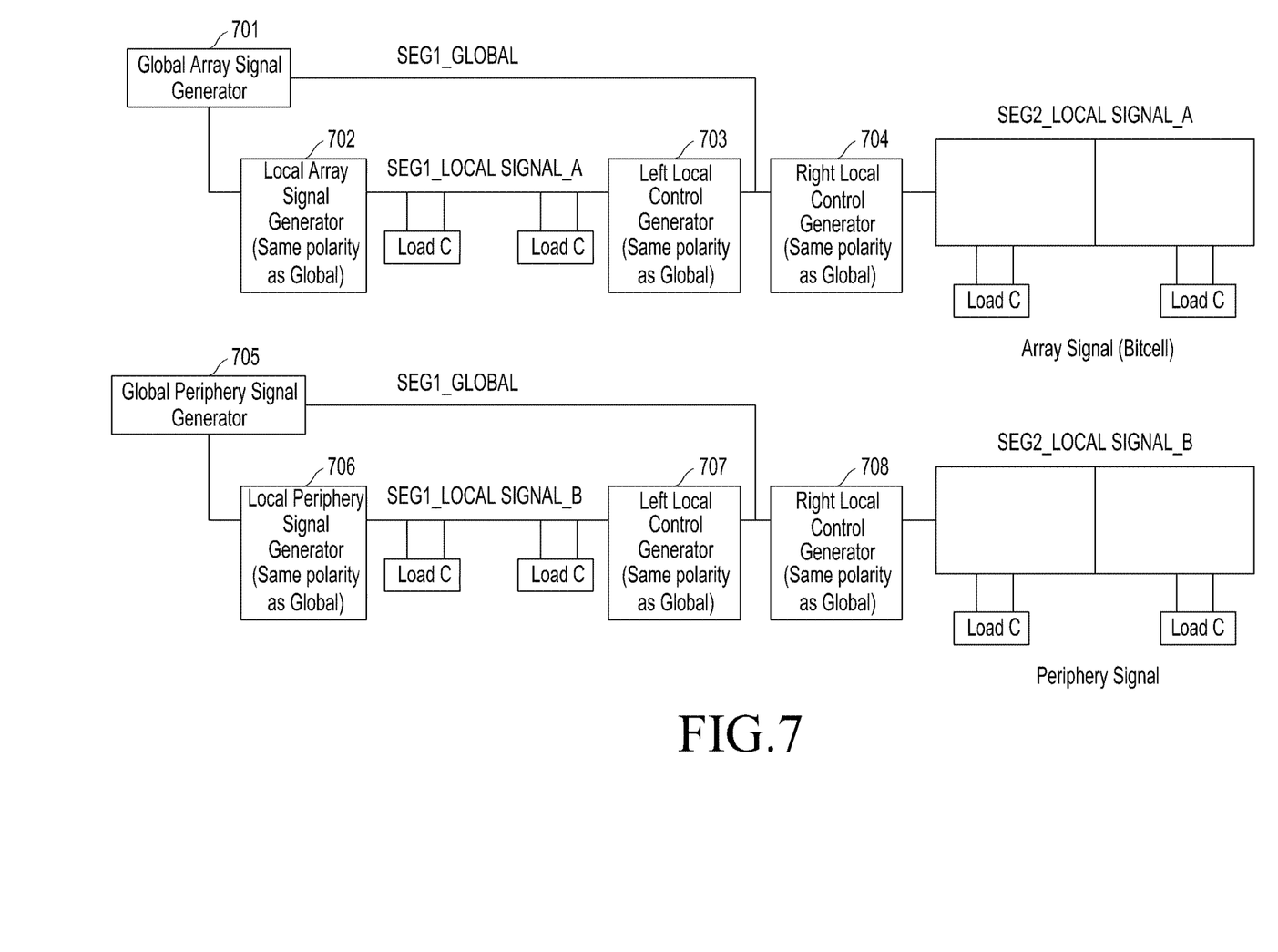
FIG. 7 is a schematic diagram illustrating an unevenly distributed global and local scheme with a two-sided local buffer for higher range columns, according to an example embodiment.

FIG. 7 is a schematic diagram illustrating an unevenly distributed global and local scheme with a two-sided local buffer for higher range columns, according to an example embodiment. The example embodiment provides a two-sided local buffer scheme to improve wordline slope and robustness of bit cells. According to an aspect of the example embodiment, a global array signal generator 701 for generating array signals provides an input signal SEG1_GLOBAL to a local array signal generator 702 (local array signals generated by which have the same polarity as the global array signals of the global array signal generator 701), which in turn provides an input signal SEG1_LOCAL SIGNAL_A to a load C and a left local control generator 703, by which local control signals generated have the same polarity as the global array signals of the global array signal generator 701. The global array signal generator 701 also provides an input signal SEG1_GLOBAL to a right local control generator 704 (local control signals generated by which have the same polarity as the global array signals of the global array signal generator 701), which in turn feeds a load C. A global periphery signal generator 705 for generating periphery signals provides an input signal SEG1_GLOBAL to a local periphery signal generator 706 (local periphery signals generated by which have the same polarity as the global periphery signals of the global periphery signal generator 705), which in turn provides an input signal SEG1_LOCAL SIGNAL_B to a load C and a left local control generator 707, of which local control signals have the same polarity as the global periphery signals of the global periphery signal generator 705. The global periphery signal generator 705 also provides an input signal SEG1_GLOBAL to a right local control generator 708 (of which local control signals have the same polarity as the global periphery signals of the global periphery signal generator 705, which in turn feeds an output signal SEG2_LOCAL SIGNAL_B to a load C.

According to an aspect of an example embodiment, a memory system may include a plurality of bit cell loads, one or more global signal generators (701), one or more global word line segments (SEG1_GLOBAL), one or more local word line segments, and a plurality of buffers. The global signal generator (701) is configured to generate a global array signal. The one or more local word line segment is configured to drive the plurality of bit cell loads.

In one example embodiment, the global signal generator (701) is connected to the global word line segment (SEG1_GLOBAL) having a first end and a second end. The first end of the global word line segment (SEG1_GLOBAL) is connected to the global signal generator (701), and the second end of the global word line segment (SEG1_GLOBAL) is connected to a second buffer (703) and a third buffer (704). The global signal generator (701) is further connected to a first local word line segment (SEG1_LOCALSIGNAL_A) via a first buffer (702) and the second buffer (703), wherein a first end of the first local word line segment (SEG1_LOCALSIGNAL_A) is connected to the first end of the global word line segment (SEG1_GLOBAL) via the first buffer (702) and a second end of the first local word line segment (SEG1_LOCALSIGNAL_A) is connected to the second end of the global word line segment (SEG1_GLOBAL) via the second buffer (703). The global word line segment (SEG1_GLOBAL) is further connected to a second local word line segment (SEG2_LOCALSIGNAL_A) via a third buffer (704). The first local word line segment (SEG1_LOCALSIGNAL_A) is configured to drive a first group of bit cell loads and the second local word line segment (SEG2_LOCALSIGNAL_A) is configured to drive a second group of bit cell loads.

The first group of bit cell loads has a greater number of bit cells loads than the second group of bit cell loads which are configurable. According to an example embodiment, the first group of bit cell loads are at least two times more than the second group of bit cell loads. For example, the first group of bit cell loads may comprise 224 bit cell loads and the second group of bit cell loads may comprise 96 bit cell loads. The global word line segment and the both local word line segments have signals of the same polarity.

Although example embodiments are described, it will be obvious for a person skilled in the art to practice the disclosure with modifications. However, all such modifications are deemed to be within the scope of the claims.

What is claimed is:

1. A memory, comprising:
a plurality of columns of memory cells configured to receive array signals;
a control circuit connected to each of the plurality of columns of the memory cells, for providing periphery signals; and
a control logic unit connected to the control circuit and each of the plurality of columns of the memory cells through a hierarchical structure of global control lines and local control lines,
wherein the control logic unit is configured to provide the array signals having a same polarity to the global control lines and the local control lines, and the periphery signals have the same polarity to the global control lines and the local control lines,
wherein the control logic unit has the hierarchical structure of the global control lines and the local control lines for providing the array signals and the periphery signals, and
wherein the control logic unit is further configured to reduce delay between a global array signal and a global periphery signal.

2. The memory of claim 1, wherein the control logic unit comprises at least one of a decoder, a buffer, and a rebuffer, for each of the plurality of columns of the memory cells.

3. The memory of claim 2, wherein the rebuffer is connected between the global control lines in each of the plurality of columns of the memory cells, where a number of the memory cells exceeds a predefined number.

4. The memory of claim 1, wherein each of the local control lines is configured to provide a local control signal though parallel metal bit lines of one of a same type and a different type in the local control lines, where a number of the memory cells exceeds a predefined number.

5. The memory of claim 1, further comprising a rebuffer configured to provide a two-sided local buffered signal for generating local array signals and local periphery signals.

6. The memory of claim 1, wherein the control logic unit has the hierarchical structure of the global control lines and the local control lines for providing the array signals and the periphery signals, and
wherein the control logic unit is further configured to reduce delay between a local array signal and a local periphery signal.

7. A memory, comprising:
a global array signal generator configured to generate global array signals;
a local array signal generator connected to the global array signal generator, and configured to receive the global array signals from the global array signal generator and generate local array signals;
a global periphery signal generator configured to generate global periphery signals;
a local periphery signal generator connected to the global periphery signal generator and configured to receive the global periphery signals and generate local periphery signals;
a plurality of columns of memory cells;
a control circuit connected to each of the plurality of columns of the memory cells through the local periphery signal generator; and
a control logic unit connected to the control circuit and each of the plurality of columns of the memory cells through a hierarchical structure of global control lines and local control lines,
wherein the control logic unit is configured to provide the global array signals and the local array signals, having a same polarity with each other, to the global control lines and the local control lines, and provide the global periphery signals and the local periphery signals, having the same polarity, to the global control lines and the local control lines,
wherein the control logic unit has the hierarchical structure of the global control lines and the local control lines for providing array signals and periphery signals, and
wherein the control logic unit is further configured to reduce delay between a global array signal and a global periphery signal.

8. The memory of claim 7, wherein the local array signal generator is further configured to generate the local array signals based on the global array signals, and
the local periphery signal generator is further configured to generate the local periphery signals based on the global periphery signals.

9. The memory of claim 7, wherein the control logic unit comprises at least one of a decoder, a buffer, and a rebuffer, for each of the plurality of columns of the memory cells.

10. The memory of claim 9, wherein the rebuffer is connected between the global control lines in each of the plurality of columns of the memory cells, where a number of the memory cells exceeds a predefined number.

11. The memory of claim 7, wherein each of the local control lines is configured to provide a local control signal though parallel metal bit lines of one of a same type and a different type in the local control lines, where a number of the memory cells exceeds a predefined number.

12. The memory of claim 7, further comprising a rebuffer configured to provide a two-sided local buffered signal for generating the local array signals and the local periphery signals.

13. The memory of claim 7,
wherein the control logic unit is further configured to reduce delay between a local array signal and a local periphery signal.

14. A memory comprising:
a global signal generator configured to generate a global array signal;
a global word line segment connected to the global signal generator, wherein a first end of the global word line segment is connected to the global signal generator, and a second end of the global word line segment is connected to a second buffer and a third buffer;
a first local word line segment connected to the global signal generator via a first buffer and the second buffer, wherein a first end of the first local word line segment is connected to the first end of the global word line segment via the first buffer and a second end of the first local word line segment is connected to the second end of the global word line segment via the second buffer; and
a second local word line segment connected to the global word line segment via the third buffer,
wherein the first local word line segment is configured to drive a first group of bit cell loads and the second local word line segment is configured to drive a second group of bit cell loads.

15. The memory of claim 14, wherein the first group of bit cell loads has a greater number of bit cells loads than the second group of bit cell loads.

16. The memory of claim 14, wherein the first group of bit cell loads are at least two times more than the second group of bit cell loads.

17. The memory of claim 14, wherein the global word line segment and the first local word line segment have same polarity signals.

18. A method operating by a memory, the method comprising:
generating global array signals;
generating local array signals based on the global array signals;
generating global periphery signals;
generating local periphery signals based on the global periphery signals;
providing the global array signals and the local array signals, having a same polarity with each other, to global control lines and local control lines; and
providing the global periphery signals and the local periphery signals, having the same polarity, to the global control lines and the local control lines,
wherein the memory comprises a control logic unit, and the control logic unit has a hierarchical structure of the global control lines and the local control lines for providing array signals and periphery signals, and
wherein the control logic unit is further configured to reduce delay between a global array signal and a global periphery signal.

* * * * *